United States Patent [19]

Gussman et al.

[11] Patent Number: 4,567,652

[45] Date of Patent: Feb. 4, 1986

[54] BURN-IN BOARD LOADER

[75] Inventors: Robert L. Gussman; James B. Karp, both of Houston, Tex.

[73] Assignee: Reliability Incorporated, Houston, Tex.

[21] Appl. No.: 442,518

[22] Filed: Nov. 18, 1982

[51] Int. Cl.⁴ .................... H05K 3/30; B23P 19/00
[52] U.S. Cl. .................................. 29/837; 29/741; 29/742; 29/759; 29/809
[58] Field of Search ............... 29/837, 809, 838, 839, 29/739, 740, 741, 742, 759

[56] References Cited

U.S. PATENT DOCUMENTS

| | | | |
|---|---|---|---|
| 3,442,430 | 5/1969 | Ackerman et al. | 227/2 |
| 3,508,315 | 4/1970 | Hoffken | 29/203 |
| 3,545,064 | 12/1970 | Zemek et al. | 29/203 |
| 3,710,479 | 1/1973 | Bernardo et al. | 29/203 B |
| 3,727,284 | 4/1973 | Ragard et al. | 29/203 B |
| 3,893,232 | 7/1975 | Fletcher et al. | 29/626 |
| 4,063,347 | 12/1977 | Woodman, Jr. | 29/564.1 |
| 4,070,753 | 1/1978 | Liu | 29/741 |
| 4,099,325 | 7/1978 | Baker | 29/741 |
| 4,115,919 | 9/1978 | Woolley, Jr. et al. | 29/740 |
| 4,116,348 | 9/1978 | Atchley et al. | 214/309 |
| 4,161,064 | 7/1979 | Woodman, Jr. et al. | 29/741 |
| 4,196,513 | 4/1980 | Harigane et al. | 29/741 |
| 4,212,102 | 7/1980 | Drinkard, Jr. | 29/741 |
| 4,234,418 | 11/1980 | Boissicat | 209/542 |
| 4,250,615 | 2/1981 | Knuth et al. | 29/741 |
| 4,304,514 | 12/1981 | Pfaff | 414/224 |

OTHER PUBLICATIONS

Pearson, "Automated Loading/Unloading for IC Burn-In Boards," *Microelectronic Manufacturing and Testing* (Nov. 1981).

Primary Examiner—Howard N. Goldberg
Assistant Examiner—P. W. Echols
Attorney, Agent, or Firm—David S. Wise

[57] ABSTRACT

An apparatus for inserting integrated circuit packages into sockets on a burn-in board includes a plurality of loader heads, one for each column of sockets on the board, for pushing the packages into the sockets; a plurality of support means, one for each loader head, for aligning and supporting the package under the loader head; and a plurality of channels, one for each loader head, for delivering IC packages to the support means. Movement of the loader head in the downward direction clamps the IC package between the loader head and the support means for insertion of the package into the socket.

14 Claims, 12 Drawing Figures

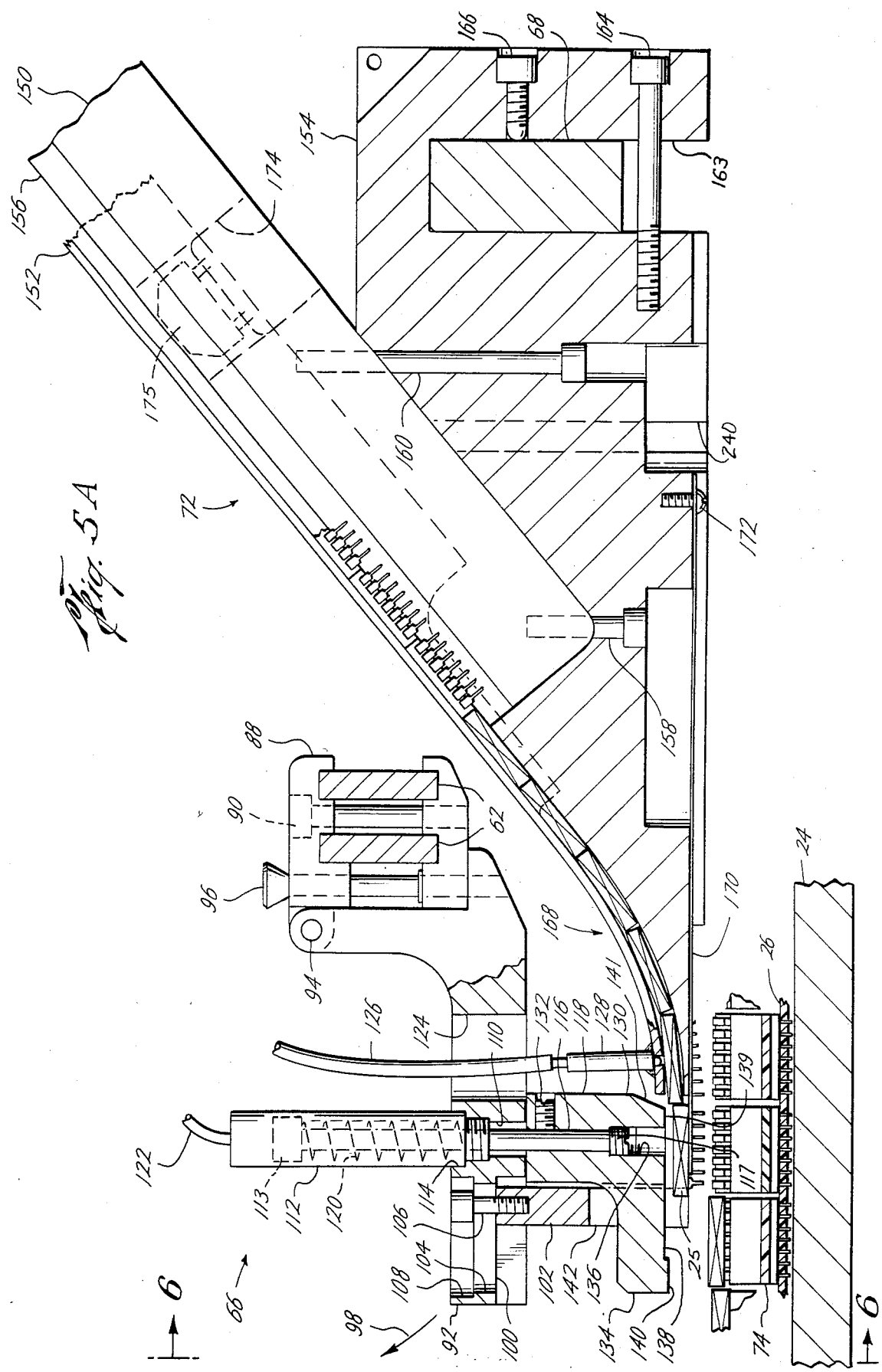

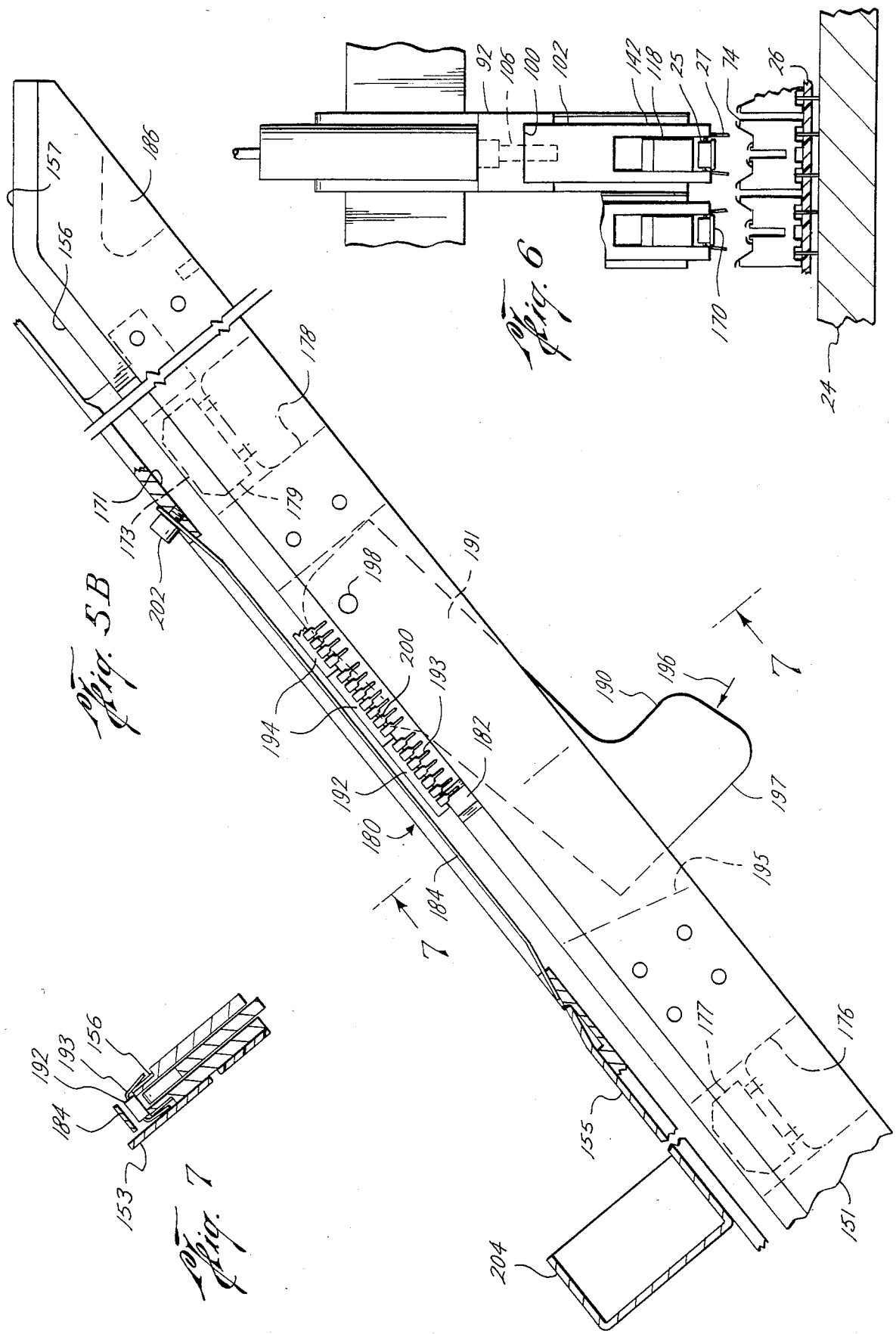

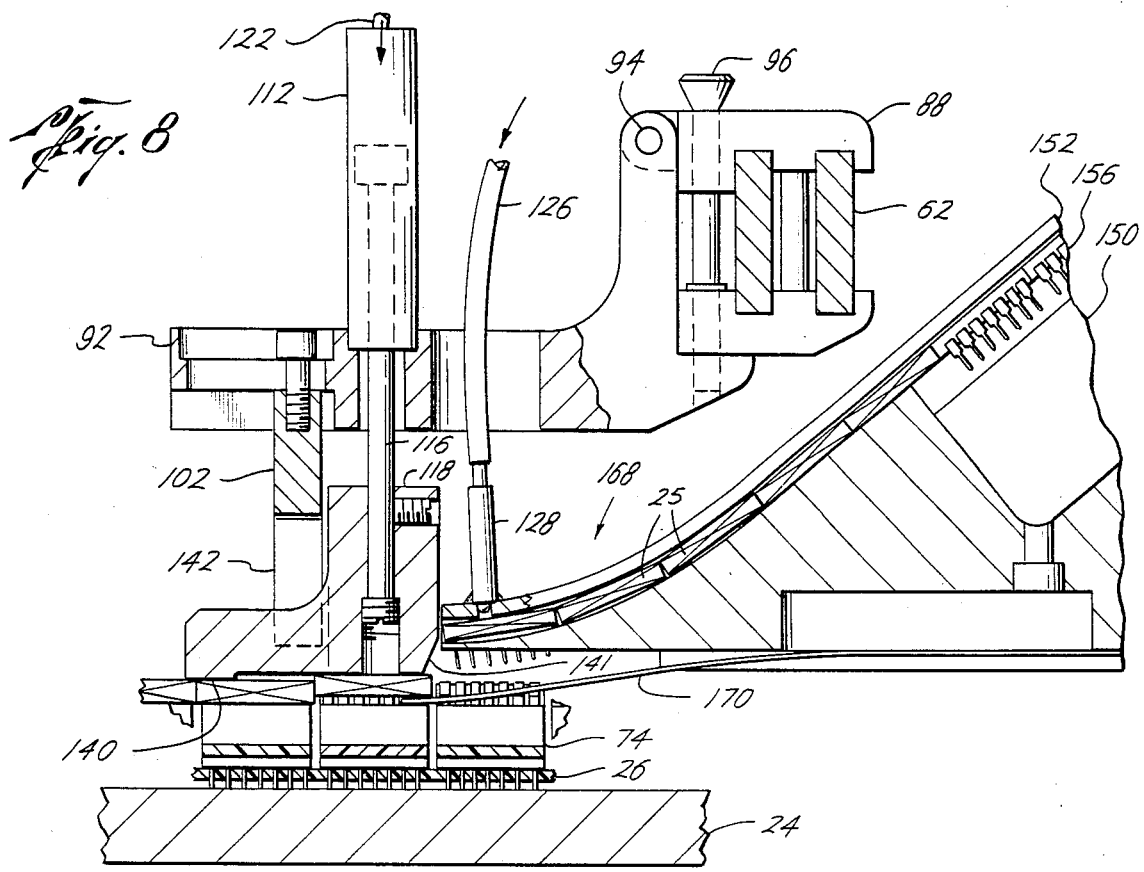
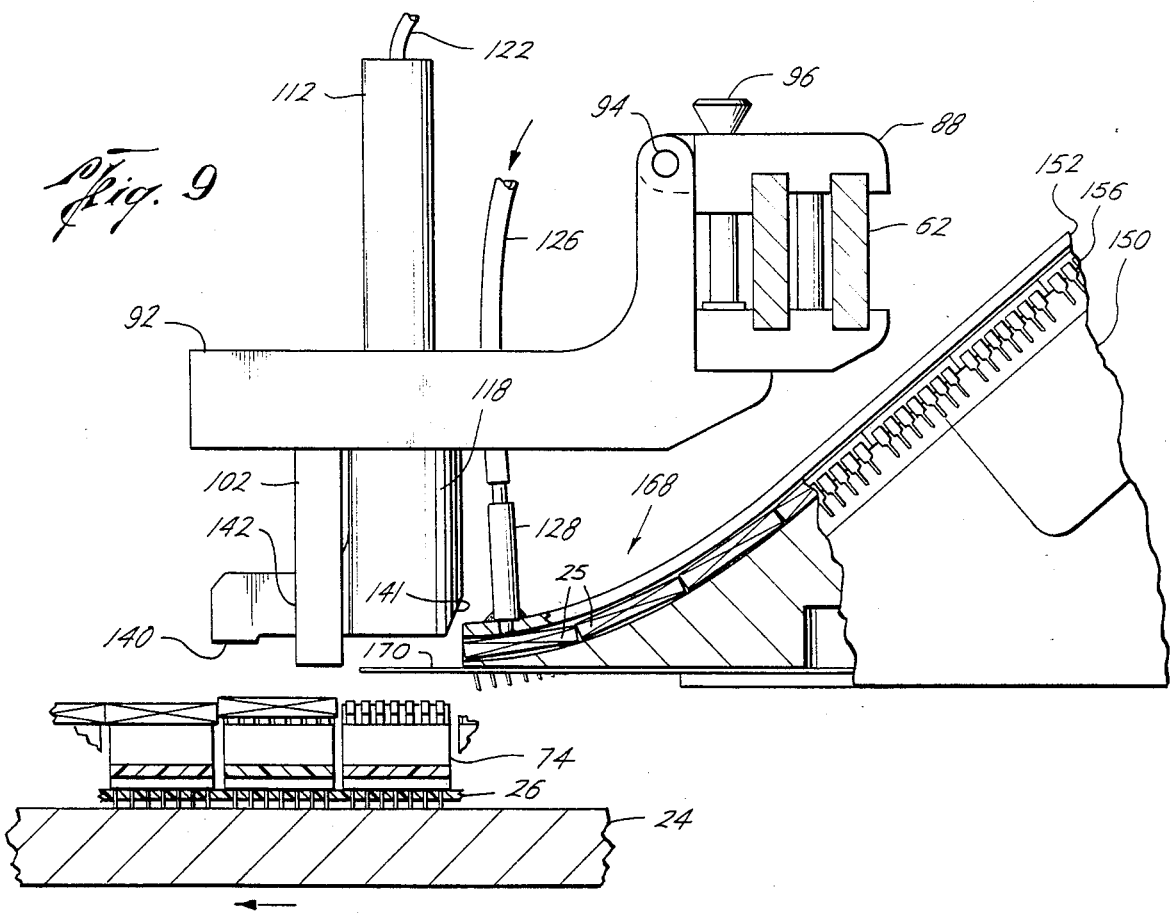

BURN-IN BOARD LOADER

BACKGROUND OF THE INVENTION

The present invention relates generally to the field of automated apparatus for handling electronic circuit components and, more particularly, to automated apparatus for use in the art of burning-in circuit components prior to their distribution and use. Still more particularly, the present invention is directed to the art of automated insertion of electronic integrated circuit (IC) packages, in the form of dual in-line packages, into sockets on printed circuit (PC) boards for subsequent burning-in.

According to present practices, IC packages are massproduced and installed in electronic circuits within highly sophisticated, complex and costly equipment. As with many massproduced products, IC packages are prone to failure, in many cases within the first one thousand hours of operation. The complexity of the equipment within which such packages are installed makes post-installation failures highly undesirable. For example, when equipment reaches the final inspection stage of production, before failures are detected, the high level skills required for testing and repair add a significant cost to production expenses. Even more significantly, when the product has been installed in the field and a service technician must make warranty repairs, the costs thereby incurred can have a significant effect on profitability. As a result, manufacturers of electronic equipment are damanding ever greater quality and dependability in commercial grade IC packages.

Quality and dependability is enhanced substantially by detection of those IC packages likely to fail in the first few hours of operation, prior to installation of the packages in electronic equipment. One of the most effective methods for detecting flawed IC packages is referred to as "burn-in". According to burn-in techniques, IC packages are stressed within their physical and electrical limits prior to installation, whereby those packages likely to become early failures in completed equipment can be discovered.

Burn-in involves placing a large number of IC packages on one or more PC boards ("burn-in boards"); placing the burn-in boards with the packages mounted thereon in a chamber whose environment, particularly temperature, is controllable; applying direct current (dc) biases to each package on each board in such a manner as to forward and reverse bias as many of the package's junctions as possible, and/or actively clocking each package to its maximum rated conditions, such application of dc biases, clock signals, and loads being accomplished substantially simultaneously to each package; removing the component boards from the chamber after the IC packages have been subjected to the environmental condition of the chamber and the biases, clock signals, and loads for a designated period of time; and removing the IC packages from the burn-in boards.

The IC packages can be electrically tested either within or outside the burn-in chamber, depending on the sophistication of the particular chamber, by applying a room temperature test of critical dc parameters, e.g., input currents and thresholds, output voltages and currents, and, in the case of digital components, by making a functional test to verify truth table performance. In this way, the packages that fail during burn-in are detected and segregated from those that do not fail. Because the packages that do not fail during the burn-in process have withstood substantial stress, such IC packages possess a high degree of dependability and can be installed in highly complex equipment with reasonable confidence that such IC packages will not fail prematurely.

The burn-in process, however, although successful in reducing the expense of troubleshooting failed electronic equipment, is not itself without expense. Substantial capital expenses are necessary to purchase or construct burn-in chambers, burn-in boards, and test equipment. Personnel must be employed and trained to operate the equipment and to monitor the time-consuming process. In some cases entire businesses have been built around performance of the burn-in process. Use of the burn-in process and, consequently, the success of a business that provides a burn-in service, is dependent upon the cost effectiveness of burning-in the IC packages vis-a-vis not burning-in the packages but instead replacing those that fail after installation and use in the field.

One means for improving the cost effectiveness of the burn-in process is a reduction in labor cost, particularly the labor cost associated with loading and unloading IC packages from sockets on burn-in boards. Consequently, efforts were undertaken to automate, in varying degrees, the loading and unloading stages of the process. The savings in labor cost alone can be substantial. For example, assume that a typical efficient worker may load at an insert rate of 1,000 IC packages per hour (although a lower insert rate would be more probable). The insert rate is the rate at which IC packages are actually placed in sockets on a burn-in board, disregarding the time consumed by any activity other than inserting IC packages in the sockets. The insert rate should be distinguished from the throughput rate, which equals the number of IC packages inserted per unit of time including time-consuming overhead chores, such as removing and replacing burn-in boards and loading IC packages into channels, as well as the actual time required to insert the packages. If a pace of 1,000 packages per hour could be maintained for seven of eight daily working hours, a manual insert rate of 7,000 packages per person per day may be achieved. A well designed automatic loader, operated by the same individual, typically could achieve an insert rate of at least 56,000 packages per eight-hour day.

A savings in the cost of labor is not the sole justification for automating the burn-in board loading process. Consistent insertion force, proper package placement, and controlled insertion pressure minimizes wear and tear on burn-in board sockets and socket contacts. Typical manual insertion involves a rolling motion of the hand, which subjects the socket contacts to large flexure forces. After a period of time, the contacts may become fatigued to the point where they do not spring back adequately to assure a good wiping contact.

Automated burn-in board loaders also may prove less hazardous to the IC packages inserted that their human counterparts. A properly designed loader may improve the quality of the service by reducing human contact with the packages, which contact might damage the packages, and by controlling the insertion force, which may reduce the frequency of bent electrical leads on the packages. Hence, automated burn-in board loaders may potentially reduce the cost of labor, extend the average life of a burn-in board, and reduce damage to the IC packages.

Although published art exists relative to the automated insertion of electronic components directly onto PC boards, such art is not deemed generally pertinent to the art of loading burn-in boards. First, burn-in board loaders insert packages onto sockets, which do not vary from socket to socket; whereas, component loaders insert components directly onto the PC board or into a variety of types of sockets. Second, burn-in boards typically are characterized by a uniform arrangement of sockets across an entire board; whereas, a typical PC board not designed for burn-in use is characterized by an apparently random arrangement of component positions across the board. Finally, the packages inserted on a single burn-in board, or a plurality thereof, are all of the same type, having the same size and other physical characteristics; whereas, the components handled by inserters outside the burn-in art may be any of a variety of types, including resistors, capacitors, IC packages, transistors, and the like, giving rise to a wide assortment of sizes, shapes, and number of leads among the components.

The net result of the aforestated differences is reflected in substantially different requirements for general component insertion as compared to burn-in board loading. On the whole, unless designed for a very narrow application, a general component inserter is complex and is slow. The variations inherent to component inserters as to type of target (i.e., socket or PC board), as to position and orientation of the target, and as to component size and shape have spawned apparatus which is of limited value to the art of burn-in board loaders.

U.S. Pat. No. 3,442,430 to Ackerman et al. discloses an apparatus for inserting IC packages onto a PC board. The apparatus comprises a component support, a component feeding assembly adapted to transfer components one at a time onto the support from a suitable supply of components, and a reciprocal component inserter which is adapted to lift a component from the support, which then rotates out of the path of the inserter, and thereafter inserts the component onto a PC board.

Ackerman et al. does not teach the art of burn-in board loading and, consequently, reveals only a particular mechanical apparatus for delivering a component from a place of storage to a point on a PC board. Ackerman et al. apparently does not disclose means for positioning the apparatus and the target point on the PC board relative to one another. Rapid positioning with high accuracy is essential to the operation of an effective burn-in board loader. In addition, Ackerman et al. discloses but a single insertion mechanism which apparently would operate at a relatively slow pace. The physical bulk of the apparatus prohibits a plurality of such devices operating simultaneously on the same board. Consequently, it is doubtful that implementation of Ackerman et al. or any of the features disclosed therein in a burn-in board loader would yield a cost-effective apparatus.

U.S. Pat. NO. 4,304,514 to Pfaff discloses an apparatus designed particularly for the purpose of loading and unloading burn-in boards. The portion of the apparatus for loading a burn-in board includes a support surface, which receives a gravity-fed supply of circuit packages from a channel, a pressure pad, which is spaced apart from the support surface whereby a circuit package may be slidably received therebetween, and an air cylinder with a shaft which supports the support surface and pressure pad. Actuation of the air cylinder causes the circuit package to be lowered with the support surface to a socket, whereupon the pressure pad forces the circuit package into the socket while the support surface lowers into a slot down the center of the socket so as not to frustrate insertion by the pressure pad. When insertion is completed, the burn-in board is repositioned to slide the support surface from beneath the circuit package and the air cylinder shaft is retracted.

The apparatus of Pfaff, although apparently sound from a functional point of view for use in loading a burn-in board, leaves unresolved certain problems which are evident when a burn-in board loader is operated in an actual working environment. The primary purpose for a burn-in board loader, as pointed out above, is to increase the throughput rate for board loading without a corresponding increase in overhead expense and to improve the quality of the loading process. Yet, certain features of Pfaff, or the lack thereof, tend to diminish the throughput rate which might otherwise be achieved.

It appears that the physical arrangement of the apparatus of Pfaff inhibits the removal and replacement of burn-in boards, so as to redce the speed with which an operator can perform such a task. It further appears that the apparatus has only limited provision for storage of IC packages which are ready to be burned-in, requiring constant attention of the operator to replenish the supply of the packages. The apparatus of Pfaff is capable of loading at most three columns of sockets simultaneously, necessitating the time-consuming process of repositioning of the burn-in board in a lateral as well as longitudinal direction. Because the spacing between the three loader columns of the apparatus is fixed, the apparatus apparently would not be readily adaptable to burn-in boards of a different size. Hence, a different apparatus must be constructed for each size burn-in board used.

Often times fatigue of a socket due to normal wear and tear will necessitate its removal from the burn-in board, leaving an open position on the board. The apparatus of Pfaff makes no provision for detecting such positions. The longitudinal alignment mechanism of Pfaff, including light emitting and detecting devices, appears to be inadequate to align by rows of sockets on a burn-in board where the spacing between rows is very close or is obscured by components, such as capacitors, on the burn-in board. The control system of Pfaff, although not disclosed in any detail, centers around a programmable controller, which permits only limited feedback control and no troubleshooting capability.

Finally, the support surface of Pfaff, inasmuch as it does not span the width between the two rows of electrical leads on the IC package, allows substantial freedom for the package to shift around on the support surface and, hence, to move out of alignment with the socket. This particular feature of Pfaff is critical because, if the IC package is misaligned on the support surface, the electrical leads of the package will not drop into the socket contacts when the package is lowered and consequently the package will be crushed. Thus, the frequency at which the Pfaff apparatus is likely to "crunch," as it is known in the industry, IC packages is unacceptably high.

Hence, it is apparent that the process of burning-in IC packages has become a valued asset to the semiconductor industry and that the success and expansion of the process is directly related to the development of an efficient and reliable burn-in board loader having an optimum throughput rate. It should further be apparent that certain known apparatus do not fully address the requirements of such a device.

SUMMARY OF THE INVENTION

Accordingly, there is provided an apparatus for loading integrated circuit (IC) packages into sockets on a burn-in board, including means for pushing an IC package into a socket and means for supporting the IC package from an underside thereof and thereby biasing the IC package against the pushing means. An angularly disposed channel means is arranged to deliver IC packages to the support means.

The pushing means may include an alignment mechanism which properly positions the IC package above the socket by contact with the electrical leads of the package, rather than the body portion of the package. The channel means may include a policing station for isolating and rejecting IC packages having deformed electrical leads which would not properly slide into a socket. The channels may also include a plurality of sensors therewithin for monitoring the progress of IC packages therethrough. Signals from the channel sensors may be interpreted to provide to an operator an indication as to when a channel should be replenished with IC packages and when the policing station has isolated a deformed IC package for rejection.

A table onto which the burn-in board is clamped is slidably supported on a frame, the table having coupled thereto means for positioning the table in response to electrical signals so as to properly position the socket under the pushing means. Sensor means may be included to indicate the position of the table.

The loader apparatus may be arranged to include one combination of pushing means, support means, and channel means for each row of IC sockets on the burn-in board. Such an arrangement improves both the insert and throughput rates by enabling a burn-in board to be fully loaded while making a single pass beneath the apparatus and reduces the complexity of the means for positioning the table by requiring that the table move in but a single dimension. Each combination of pushing means, support means, and channel means may be slidably adjusted laterally for alignment with a particular column of sockets to accommodate burn-in boards of various dimensions.

The loader apparatus further includes a control system for receiving electrical signals from sensors and delivering electrical signals to apparatus so as to produce smooth operation of the automated insertion process.

These and various other objects and advantages of the present invention will become readily apparent to those skilled in the art upon reading the following detailed description and claims and by referring to the accompanying drawings.

BRIEF DESCRIPTION OF THE DRAWINGS

FIG. 5A shows a side elevation of a loader head and the lower portion of a loader channel;

FIG. 5B shows a continuation of the side elevation of FIG. 5A, revealing the upper portion of the loader channel;

FIG. 6 shows a front view of the apparatus shown in FIG. 5A along line 6—6 as shown therein;

FIG. 7 shows a cross-section of the side elevation of FIG. 5B taken along line 7—7 as shown therein;

FIGS. 8 and 9 show a side elevation of the loader head as it inserts an IC package into a socket;

DESCRIPTION OF THE PREFERRED EMBODIMENT

"Burn-in" refers generally to the technique whereby integrated circuit (IC) packages are stressed within their physical and electrical limits prior to their sale or distribution so that those packages likely to become early failures in completed equipment can be discovered. The burn-in technique includes loading the IC packages into sockets on burn-in boards, placing the burn-in boards in a chamber whose environment, particularly temperature, is controllable, applying electrical test signals to the boards while subjecting the IC packages to the maximum temperature rating therefor, removing the burn-in boards from the chamber, and unloading the IC packages from the burn-in boards.

Figure 1:
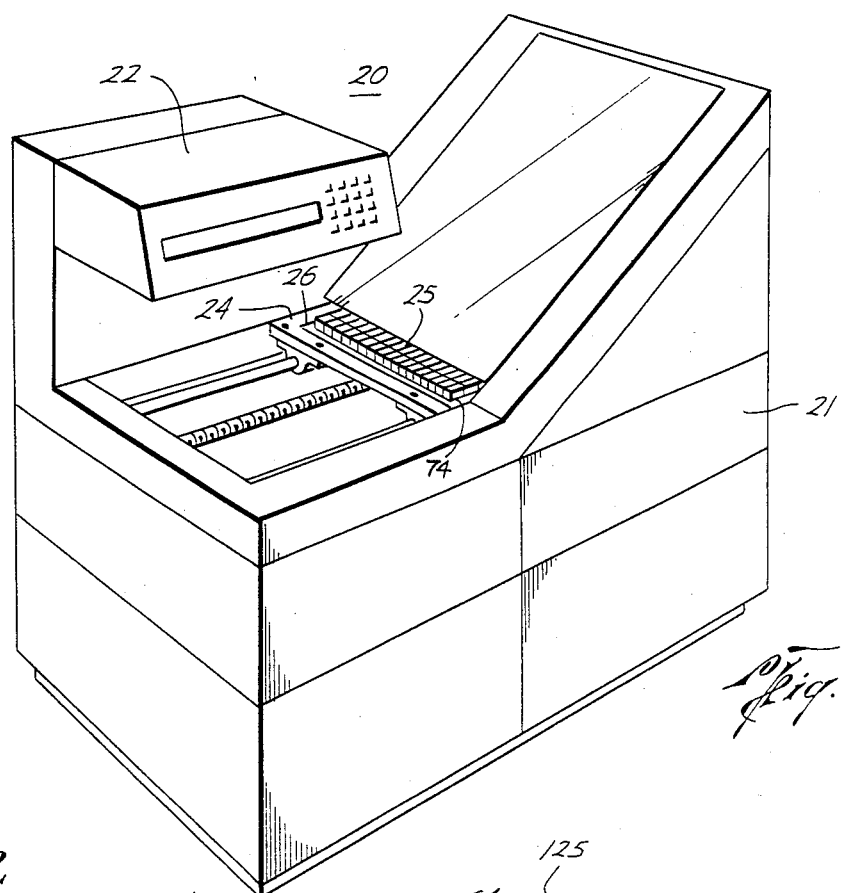
FIG. 1 shows a perspective view of a loader apparatus structured according to the principles of the invention.

Referring initially to FIG. 1, there is shown a loader apparatus 20 for automatically loading IC packages 25 into sockets 74 on burn-in boards 26. Typical IC packages, as are referred to herein, comprise a body portion or cartridge, which is generally a parellelepiped having from four to sixty-four electrical leads of a generally L-shaped cross-section extending out and down from the opposing sides of the cartridge. The overall width of the IC package may be, for example, 0.3, 0.4, or 0.6 inch. The sockets 74 mounted on burn-in boards 26, as shown in FIGS. 5A and 6, include socket contacts defining slots for receiving electrical leads on IC packages. The IC package 25 also may be a leadless component sometimes referred to as a "chip," which is of a square or rectangular geometry and a relatively thin cross-section, giving the chip an overall wafershaped appearance. In the usual construction, the chips have conductive coatings applied to select edges, or in some cases at select areas on the major chip surfaces, requiring proper orientation of the chip before mounting onto a circuit substrate.

Referring again to FIG. 1, loader 20 is shown enclosed in a commercial package comprised of a plurality of sheet metal panels 21. Loader 20 includes a front panel 22 for communicating with an operator and a table 24 for supporting one or more burn-in boards 26 having sockets 74 which may be loaded with IC packages 25 by loader 20.

THE TABLE

Figure 2:
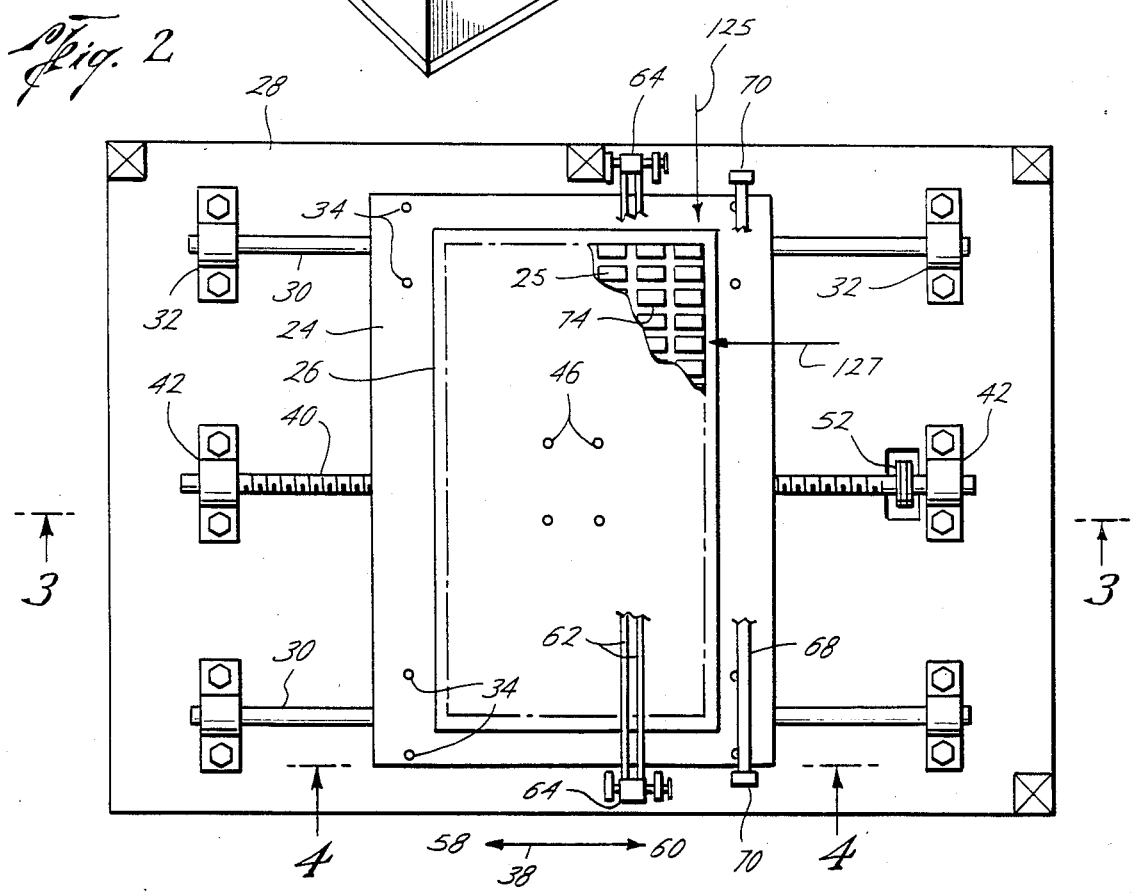
FIG. 2 shows a top view of a table of the loader of FIG. 1 with portions thereabove being removed or cut away so as to disclose pertinent portions of the apparatus.
Figure 3:
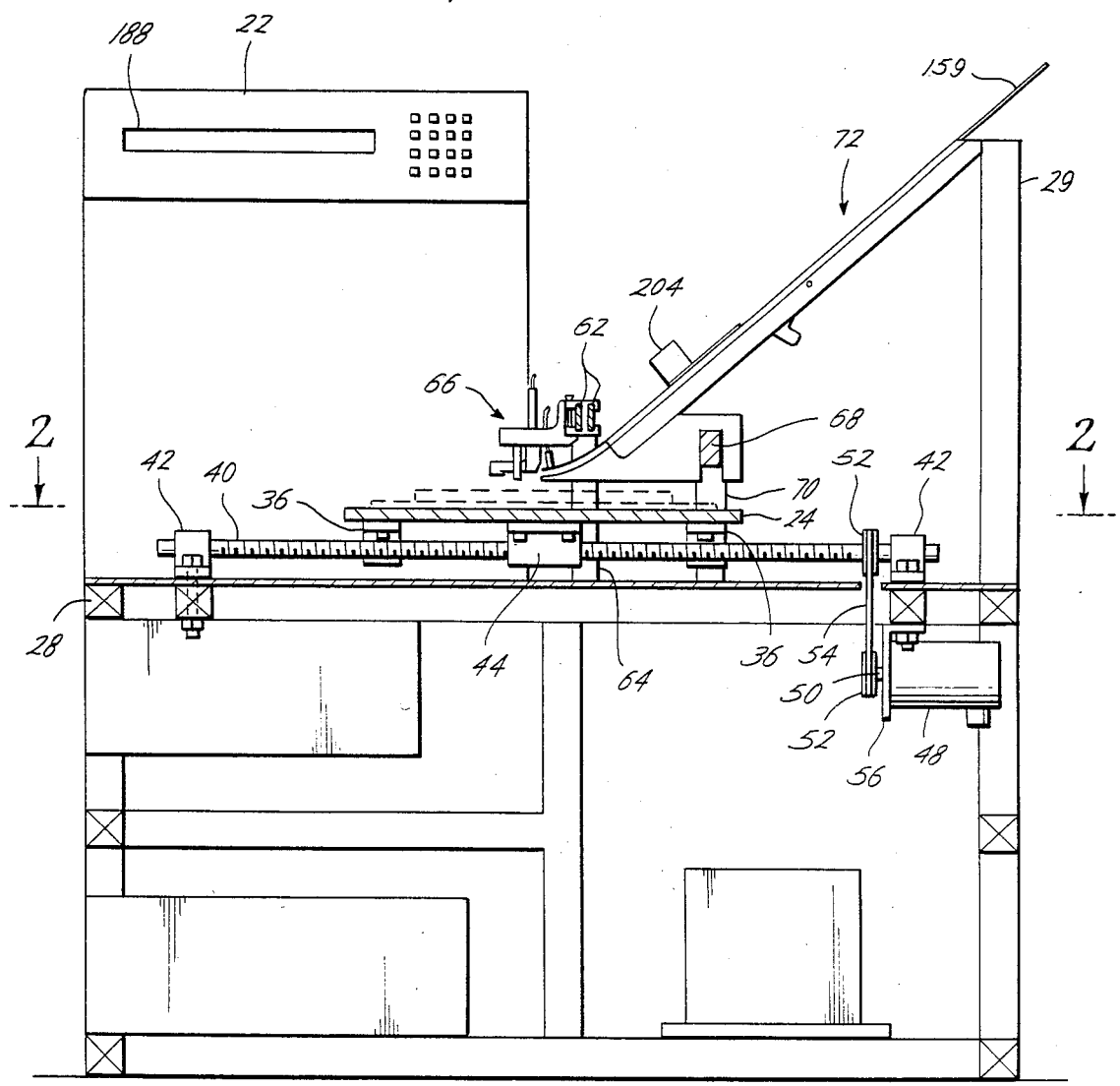
FIG. 3 shows a side elevation of the loader in cross-section taken along line 3—3 of FIG. 2.

Referring now to FIGS. 2 and 3, FIG. 2 shows a top view of the table 24 with portions thereabove being removed or cut away so as to disclose pertinent portions of the loader 20. FIG. 3 shows a side elevation of the loader 20 with certain of the sheet metal panels removed to disclose the apparatus therewithin, the elevation depicted along a line 3—3 of FIG. 2. A welded metal frame 28, constructed for example from angle iron, supports the table 24 on a pair of cylindrical support rods 30. The support rods 30 are attached to the frame at journal boxes 32, one at each end of the two support rods 30. The table 24 is reciprocally attached to the frame 28 by the support rods 30 which pass through four table support housings 36, bolted at 34 to each corner of the table 24. The table support housings 36 are slidably affixed to the support rods 30 through bearings (not shown), such as Thompson recirculating ball bushings.

The burn-in board 26 is removably affixed in a predetermined position to the tabl 24 by suitable clamping means (not shown). IC sockets 74 having therein IC packages 25 are arranged on the burn-in board 26 in a substantially close-fitting array comprised of rows which are aligned as indicated by the arrow at 125 and columns which are aligned as indicated by the arrow at 127. As is evident from FIG. 2, IC sockets 74 aligned in a row are arranged side-by-side; IC sockets 74 aligned in a column are arranged end-to-end.

The table 24 is advanced in a single direction as indicated by the arrows at 38, by means of the rotation of a threaded cylindrical metallic rod or screw 40. The screw 40 is supported at both ends therof by screw journal boxes 42 attached to the frame 28 and having therein journal bearings to permit rotation of the screw 40. Rotational motion of the screw 40 is translated the linear motion of the table 24 by means of a threaded coupling 44 affixed to the table 24 by appropriate means such as bolts 46. The threads of the coupling 44 cooperatively engage the threadlike grooves extending continuously about the circumference of the screw 40, causing the table 24 to advance linearly as the screw 40 rotates.

Rotation of the screw 40 is generated by energizing a stepper motor 48, hereinafter described in greater detail. Energizing the stepper motor 48 causes rotation of a motor shaft 50, which is coupled by means of pulleys 52 and a timing belt 54 to the screw 40. The stepper motor 48 is bolted to the frame 28 by means of a generally L-shaped bracket 56. The arrows at 38 define the direction of motion of the table 24. Motion in the direction of reference character 58 is hereafter designated as forward motion, and motion in the direction indicated at reference character 60 is hereafter designated as reverse motion.

Lateral crossbars 62 are arranged for slidable support of a plurality of loader head apparatus 66, shown generally in FIG. 3 and hereafter described in greater detail. The spacedopposed, dual lateral crossbars 62 span the width of the frame 28 and are spaced above the table 24 by a pair of appropriate end supports 64 rigidly affixed to both ends of the crossbars 62 and to the frame 28. A lateral crossbeam 68 is arranged for slidable support of a plurality of loader channels 72, shown generally in FIG. 3 and hereafter described in greater detail. The single lateral crossbeam 68 is rigidly affixed at both ends thereof by appropriate support means 70 to the frame 28 so as to space the lateral crossbeam 68 above the surface of the table 24. The slidable nature of the attachment of the loader heads 66 and loader channels 72 onto the crossbars 62 and crossbeam 68, respectively, facilitates adjustment of the lateral position of the heads 66 and channels 72 so as to accommodate a variety of sizes of burn-in boards having differing spacing between rows of sockets.

Figure 4:
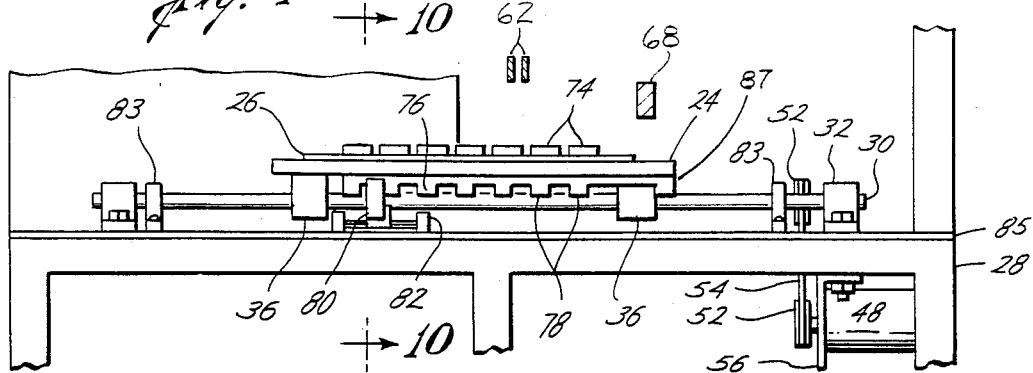
FIG. 4 shows a side elevation of the loader in a cross-section taken along line 4—4 of FIG. 2.

Referring now to FIG. 4, the loader 20 includes a control system, hereafter described in greater detail, to determine proper positioning of the table 24 with respect to loader heads 66, so as to align sockets 74 on the burn-in board 26 with the plurality of loader heads 66. A programming bar 76 having a plurality of downwardly extending teeth 78 is affixed to the lower side of the table 24. Spacing between the teeth 78 is arranged so that a vertical edge of each of the teeth 78, for example the leading edge surface of the teeth 78 of FIG. 4, may be aligned, by properly positioning the burn-in board 26 on the table 24, with the leading edge of a row of sockets 74 on the burn-in board 26.

A sensor means 80, such as a CLI 355 optoelectric device manufactured by Clairex, is arranged such that the programming bar 76 passes between two sensors which detect the presence of the leading vertical surface of the teeth 78 on programming for 76. As will be more fully described hereinafter, when sensor means 80 detects the leading edge of a tooth 78, it signals the control system that a row of sockets on the burn-in board 26 is in position for receiving an IC package. The sensor means 80 is adjustably mounted on a sensor tray 82, which is attached to the frame 28.

FIG. 4 further reveals means on the loader 20 for determining the limits of travel of the table 24, including a pair of sensor means 83, which may also be CLI 355 optoelectric devices manufactured by Clairex, affixed to a support plate 85 near the ends of one of the support rods 30. The forwardmost and rearwardmost edges on the programming bar 76 are arranged to activate and deactivate the sensor means 83, which operate through the control system to stop the table 24 at those points. The table 24 also includes a pair of safety switches in the form of ribbon switches spanning the forward-facing and rearward-facing sides of the table 24. The ribbon switches are arranged as safety switches which cooperate with the control system to shut down the loader 20 should an object, as for example the operator's hand, inadvertently contact the sides of table 24. Sensor means 83 has a design common to that of sensor means 80 and therefore only sensor means 80 will be described in further detail.

Figure 10:
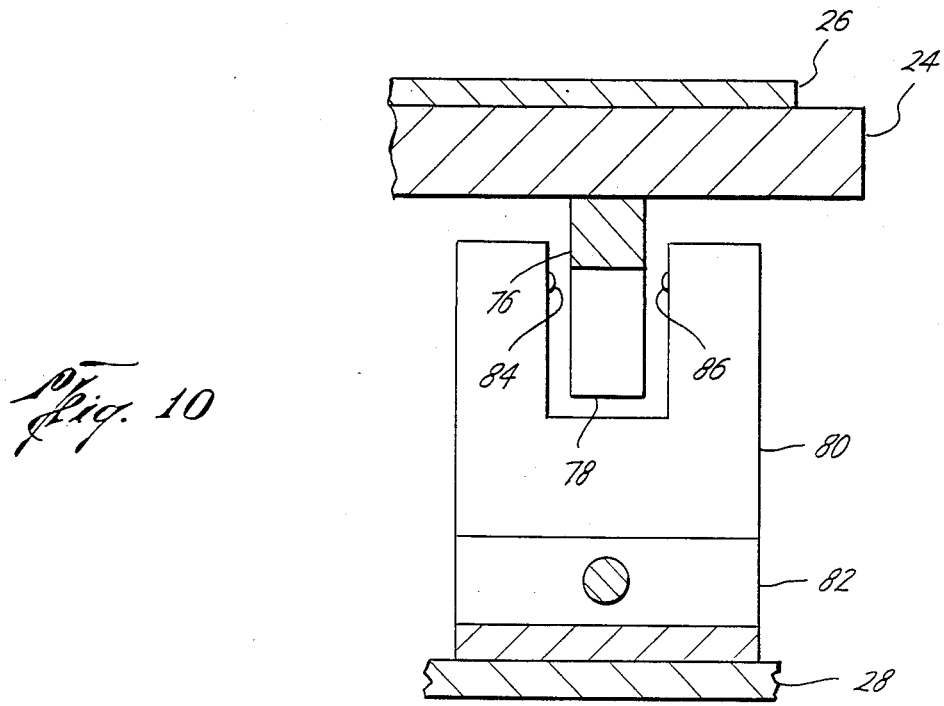
FIG. 10 shows a cross-section of the side elevation taken along line 10—10 of FIG. 4, revealing details of a sensor means for determining table position.

FIG. 10 shows an elevation of the sensor means 80 taken along a line 10—10 of FIG. 4. The sensor means 80 includes two upwardly extending portions generally defining a U-shape. One upward extension houses therewithin a light-emitting diode for generating a beam of light at 84 toward a photosensitive transistor at 86 housed within the opposing upward extension of the sensor means 80. FIG. 10 shows the diode and transistor of sensor means 80 to be in photoelectric communication, the sensor means 80 being aligned with the space between a pair of teeth 78. As the leading edge of a tooth 78 advances to block photoelectric communication between the diode and transistor, the sensor means 80 generates a signal to the control system indicating that the table is properly aligned under the loader heads 66. Thus, the presence or absence of a beam of light at 86 to activate or deactivate, respectively, the phototransistor may be utilized as an electronic switch for communicating to the control system the position of the table 24.

THE LOADER HEAD

Referring now to FIG. 5A showing the loader head 66 and a lower portion of the loader channel 72 in cross-section, the loader head 66 includes a clamping means 88, a support body 92, an IC package alignment mechanism 102, an actuation means in the form of an air cylinder 112, and a shoe mechanism 118. Each loader head 66 is slidably supported from the dual lateral crossbars 62 by the clamping means 88, which may be loosened or tightened about the crossbars 62 by adjustment of a bolt shown at 90. A loader head support body 92 is affixed to the clamping means 88 by a pivot pin 94 and a latch pin 96. The latch pin 96 may be lifted from the clamping means 88 to free the support body 92 for upward rotation about the pivot pin 94 as depicted by the arrow at 98. Such rotation permits ready access to the lower end of the loader channel 72 for servicing thereof.

The forward end of the loader head support body 92 defines a horizontal slot 100, open at the front end thereof, for slidingly receiving the alignment mechanism 102. Immediately above the slot 100 and centered with respect thereto is a channel bore 104 arranged to receive the shaft of a bolt or thumb screw 106 and a channel counterbore 108 above bore 104 for slidably receiving the head of bolt 106. Bolt 106 projects through bore 104 and threadingly engages alignment mechanism 102 for slidably attaching the alignment mechanism 102 to the support body 92.

The support body 92 further defines a vertical bore 110 positioned within the support body 92 between the slot 100 and the clamping means 88 for attaching an air cylinder 112. The upper end of the bore 110 is threaded for receiving and securing a lower threaded end of the housing of air cylinder 112. A counterbore 114 adjoins the upper threaded end of the cylinder bore 110 to define an inner horizontal annular support shoulder against which the air cylinder 112 is secured.

The loader head support body 92 further includes a clearance bore 124, sufficient in dimensions to allow a flexible air tube 126 to pass therethrough for connection to a snubber air cylinder 128 on the loader channel 72 as hereafter described. The clearance bore 124 is of sufficient size to permit the loader head support body 92 to be rotated upward in the direction indicated by the arrow at 98 without substantial interference with the position of the flexible air tube 126.

The housing of the air cylinder 112 forms a cylinder for a piston 113 mounted on the upper end of a plunger 116, which supports at a lower end thereof a shoe mechanism 118. The plunger 116 is normally biased to a retracted position, as shown in FIG. 5A, by means such as a spring 120 compressed between the bottom of the cylinder housing and the lower end of the piston 113. Pressurized air supply means (not shown) delivers pressurized air, for example 80 to 120 psi, depending on the size of the IC package 25 being inserted, through an air supply hose 122 attached to and in flow communication with the portion of the cylinder 112 above the upper end of piston 113. The plunger 116 travels downward the full length of a predetermined stroke, thereby effecting insertion of the IC package.

The shoe mechanism 118 comprises a generally downwardly extending vertical portion 130 and a generally forwardly extending horizontal portion 134, the vertical and horizontal portions substantially defining an L-shape in side elevation as shown in FIG. 5A. The vertical portion 130 includes therethrough a central bore 136 for receiving the lower end of the shaft of the plunger 116. A set screw 117 is threadingly engaged within a tapped lower portion of the central bore 136, the lower portion having a diameter which is slightly larger than that of the upper portion. The plunger 116 is affixed within the bore 136 by appropriate means such as a set screw 132 threadingly received in a tapped bore communicating with bore 136. The vertical portion 130 of the shoe mechanism 118 is of substantially the same width as the loader head support body 92.

The downwardly facing surface 138 of the shoe mechanism 118 is generally horizontal and parallel to the upper surface of the IC packages 25 to be loaded. The surface 138 includes a rearwardmost downwardly facing portion or heel 139 and a forwardmost downwardly facing portion or toe 140 which is offset downwardly, for example approximately 0.020 inch, from the surface 138. Heel 139 and toe 140 facilitate a two-stage insertion process whereby the heel 139 presses an IC package to within a short distance of full insertion within a socket 74 and the toe 140 subsequently completes the process by pressing the IC package 25 the final short distance into the socket 74. A rearwardmost side of the vertical portion 130 defines a beveled surface 141 at the lower end thereof. On downward motion of the shoe mechanism 118, the beveled surface 141 forces the lowermost IC package within the lower end of the loader channel 72 back within the loader channel to await its turn for insertion after the insertion of the IC package presently under heel 139 is completed.

The alignment mechanism 102 includes an upper body having a threaded bore therein for receiving the screw 106 for securing the mechanism 102 to the support body 92 and a pair of downwardly extending saddle alignment legs 142 which straddle the horizontal portion 134 of the shoe mechanism 118. The horizontal portion 134 is of slightly lesser width than the vertical portion 130 so as to extend with relatively close tolerance through the alignment mechanism 102. Saddle legs 142 align the IC package relative to the socket 74 prior to activation of the air cylinder 112 to push the IC package 25 into the socket 72.

THE LOADER CHANNEL

The loader channel 72 provides a steady supply of IC packages in serial fashion to the loader head 66 for insertion into a socket 74 on the burn-in board 26. The lower portion of the loader channel 72 is depicted in FIG. 5A and the upper portion of the loader channel is depicted in FIG. 5B. Each loader channel 72 is sized to accommodate IC packages 25 of a particular width. Thus, adaptation of the loader 20 from one size package to another requires, among other things, replacement of the loader channel 72. The loader channel 72 includes a track 150, a track cover 152, and a support member 154.

Support member 154 is generally trapezoidal and is slidably supported on the lateral crossbeam 68. The support member 154 is arranged with a slot 163 such that the member 154 may be installed by fitting the slot 163 over the top of the crossbeam 68. The member 154 may then be slided along the crossbeam 68 into the desired position, whereupon a bolt 164 may be secured into place so as to span the lower end of the slot 163 and a locking bolt 166 may be tightened in a tapped bore in member 154 so as to bind the crossbeam 68 within the slot 163.

The track 150 is supported at an acute angle, for example forty degrees, with respect to the horizontal by the support member 154, so as thereby to cause the IC packages to feed under the loader head 66 in response to the force due to gravity. The track 150 is attached to the support member 154 by a pair of bolts 158, 160. As a practical matter, however, the track 150 and the track member 154 may be constructed from a single piece of material, such as forging from steel. The track 150 also is supported at its upper end by an upward extension 29 of the frame 28, as shown generally in FIG. 3.

The track 150 slidably transports IC packages in serial fashion to the loader head 66 and includes a longitudinally extending upper ridge 156 protruding upwardly from a rectangular cross-section metal piece 151. Ridge 156 is generally rectangular in cross-section, as shown in FIG. 7, and is reduced equally in width on its longitudinal sides, with respect to the metal piece 151, so as to from a rail defining each side of ridge 156. The upper ridge 156 and side rails define a cross-section which conforms substantially to the cross-section of an IC package (see FIG. 7) so that the lower surface of the IC package receives ridge 156 and rides along the upper surface of ridge 156 while the downwardly extending leads of the IC package travel along the side rails of the ridge 156 relatively proximate thereto. Contact between the side rails and the electrical leads guide the IC package downwardly on track 150.

Cover 152 includes a side plate 153 and a canopy 155. The side plate 153 is affixed to one side of the rectangular metal piece 151 of track 150 and extends the length thereof. The canopy 155 is also supported by the rectangular metal piece 151, extending the length thereof and over the train of IC packages sliding along track 150. Spacing between the upper surface of the IC package and the inner surface of the canopy 155 is substantially less than the length of the leads on the IC package so as to prevent the IC package from bouncing off the track 150 or otherwise jamming along the ridge 156. The side plate 153 extends along one side of the ridge 156 so as to enclose fully the electrical leads extending from one side of the IC package and thereby effectively to lock the IC package onto the track 150.

Referring now to FIGS. 3 and 5B, the upper end of the track 150 and the track cover 152 define means for affixing an IC package storage tube (not shown) to the track 150 so as to permit IC packages to be transported from the IC tube onto the ridge 156. The upper end of the track 150 includes a substantially horizontal ridge section 157 to facilitate loading IC packages onto the ridge 156. An IC tube is held by the operator in alignment with the ridge 156, the tube being substantially horizontal and having an open end disposed above the horizontal ridge 157. As the operator raises the closed end of the IC tube, IC packages begin to slide out of the tube onto a portion of the horizontal ridge 157 and then onto the ridge 156. The horizontal ridge 157 facilitates a smooth transition of IC packages from the IC tube to the ridge 156.

The upper end of the canopy 155 includes a canopy extension 159, which comprises an upward extension of the canopy portion of the track cover 152 beyond the end of the ridge 156 and overlying the horizontal ridge 157. The cross-section of the ridge 156 and the horizontal ridge 157 is shaped substantially as an inverted U so as to conform generally to the underside of the IC tube. The open end of the IC tube may be received between the upper end of the ridge 156 and the cover extension 159, the tube being biased against the ridge 156 by the cover extension 159, so as to form a substantially linear extension of the ridge 156. In this way, the storage capacity of a channel may be increased by the length of an IC package storage tube.

In the situation where the IC packages 25 comprise the aforementioned chips, the track 150 is modified slightly to accommodate the distinctions in geometry between a dual in-line package and a chip. The chip is transported along the upper surface of the ridge 156. A pair of side plates extend upward along side the ridge 156 and above the upper surface thereof so as to guide the chips by contact with the sides thereof. The track 150 thus defines a channel for slidably transporting chips to the loader head 66.

Referring again to FIG. 5A, the forwardmost end 168 of the support member 154 comprises an extension of the track 150 for delivering the IC packages 25 into position under the loader head 66. The track extension 168 defines an arcuate ridge section for smoothly adjoining the inclined track 150 with the horizontal plane under the loader head 66. The arcuate ridge section of the extension 168 may, for example, define a radius of curvature of three inches for an arc of forty degrees.

The portion of the track cover 152 adjacent track extension 168 supports the snubber air cylinder 128, which is a small air cylinder having a normally retracted plunger therein much like that described for air cylinder 112. In response to a signal from the control system, the snubber cylinder 128 is pressurized, forcing the plunger downward to lock the lowermost IC package to the lowermost end of the ridge 156.

Referring now to FIGS. 5A and 6, a flexible loading finger 170, formed from metal or some other suitable material, is affixed by appropriate means such as a screw 172 to the lower side of the support member 154. The loading finger 170 extends forwardly beyond the forwardmost end of the support member 154 to form a substantially horizontal support surface under the loading head 66. As may be seen in FIG. 6, the loading finger 170 substantially spans the width of spacing between the electrical leads 27 of the IC package 25 so as to assure lateral alignment thereof.

As shown in FIG. 5A, the lowermost IC package drops off track 150 onto the loading finger 170. As noted, the width of the loading finger 170 is predetermined for a given size of IC package such that the electrical leads of the package fit with a substantially close tolerance around the edges of the loading finger 170. Thus, as the package drops onto the loading finger 170, it is aligned laterally over the socket 74 on the burn-in board below and the IC package thereby is prevented from moving out of lateral alignment before its insertion into a socket. The IC package 25 slides along the loading finger 170 and the forwardmost cartridge portion of the IC package passes between the saddle legs 142 of the alignment mechanism 102 until the forwardmost electrical leads 27 come into contact with the saddle legs 142, whereupon the shoe mechanism 118 is activated by the control system and presses the IC package 25 into the socket 74. The loading finger 170 biases the IC package from the underside thereof against the heel 139 of shoe mechanism 118 so as to retain the IC package 25 in alignment with the socket 74 while the package 25 is being forced downwardly by heel 139 and air cylinder 112. The loading finger 170 flexes to accommodate the insertion process. Where the IC package 25 comprises a chip, the cross-sectional geometry of the loading finger 170 is adapted to form, for example, an indentation so as to slidably retain the chip in lateral alignment in the absence of the electrical leads present on a dual in-line package.

Finally, the loader channel may include a socket probing means affixed within the support member 154 at 240. The probing means is operative while the board is moving rearward prior to loading the sockets 74 with IC packages, as hereinafter described, to verify the integrity of socket contacts and connections between the socket and the burn-in board. After a socket is in position under the probe, an air cylinder lowers the probe into the socket, electrical signals are communicated from the probe to the socket to the board and then back to the probe, and the probe is then retracted. The information acquired by the probing of each socket is retained by the control system. Sockets which are found to be defective are not subsequently loaded with IC packages.

TRACK SENSORS

Referring now to FIGS. 5A and 5B, photoelectric sensors 175, 177, 179 are situated at three points along the track 150 for detecting the presence or absence of IC packages at a particular position and for communicating such information to the control system. The sensors 175, 177, 179 may comprise any photoelectric sensor, for example, which includes a light source for generating a beam of light toward an external surface and a light sensitive device for detecting the presence of light reflected from the external surface. A photoelectric sensor found suitable for the application described herein is manufactured by Texas Instruments Corporation and includes within a single housing a light-emitting diode, TIL 139, and a phototransistor, L8218.

The three photoelectric sensors 175, 177, 179 (sometimes hereafter referred to as sensor A, sensor B, and sensor C, respectively) are retained within the rectangular metal piece 151 of the track 150 in transverse bores 174, 176, 178 extending perpendicularly to the ridge 156. Referring particularly to sensor C (179 in FIG. 5B) as representative of the three sensors 175, 177, 179, sensor C includes an upwardly directed probative surface 173 from which is emitted a beam of light from a light-emitting diode (not shown). The light beam passes through the center of the ridge 156 toward the canopy 155.

When there is no IC package present on the ridge 156 above the probative surface 173, the light beam reaches a reflective surface 171 on the lower side of the canopy 155 and is reflected thereby back to the probative surface 173, where a light-sensitive transistor (not shown) is activated by the presence of the light beam. Thus, the absence of an IC package above sensor C activates an electronic switch, in the form of the light-sensitive transistor, which switch is connected to the control system. When an IC package is present on the ridge 156 above sensor C, the lower surface of the cartridge portion of the IC package blocks the beam of light directed from the probative surface 171 of the sensor. Consequently, the light-sensitive transistor within sensor C does not detect the presence of a beam of light. Hence, the presence of an IC package above sensor C deactivates the electronic switch, which is interpreted by the control system as an indication that an IC package is present.

Table I, below, shows the relevant permutations of the three sensors as an unordered sample without replacement. The positive state of a sensor (A) represents the state of the sensor indicating the presence of an IC package. The negative state of a sensor (A') represents the state of the sensor indicating the absence of an IC package.

TABLE I

| Sensor Condition | Problem | Action |
| --- | --- | --- |
| 1. A · B · C | None | None |
| 2. A · B' · C' | Low on IC's | Warning |
| 3. A' · B' · C' | Out of IC's | Shut Down |
| 4. A · B' · C | Jam at Pol. Sta. | Warning |
| 5. A' · B' · C | Jam/Out of IC's | Shut Down |

As indicated by Table I, sensor condition 1, wherein each of the three sensors indicates the presence of a device, is the normal, desired state of affairs. Sensor conditions 2 and 3 show the state of the sensors on progressive depletion of IC packages from the channel structure 150. Sensor conditions 4 and 5 show the combination of a jam at the policing station 180, hereinafter described, and progressive depletion of IC packages from the track 150 below the policing station 180.

Referring again to FIG. 5B, the track 150 further includes a light-emitting diode (LED) positioned at 186 of the upper end of the track 150. The diode 186 is activated simultaneously with a warning or shut down message which appears on a display panel 188 (FIG. 3). Although the message appearing on the display panel 188 will indicate to the operator which of the plurality of loader channels 72 requires attention, isolating the particular loader channel may prove a time-consuming task among the many closely spaced channels. Hence, activation of the LED at 186 simultaneously with the message on the display panel 188 immediately identifies for the operator the loader channel 72 of interest. The LED may also be utilized in cooperation with the control system to perform test sequences which verify proper functioning of the track sensors.

POLICING STATION

The track 150 further includes a policing station 180 with an ejection mechanism 190 for isolating and removing from the track those IC packages having leads which are too deformed for purposes of the automatic loading process. Referring to FIGS. 5B and 7, the policing station 180 comprises a protuberance along both of the side rails of the upper ridge 156 of the track 150. The protuberance includes a widened section 182 so as to narrow the clearance between the electrical leads 193 of the IC packages 192 and the side rails of ridge 156 along which the IC packages 192 travel. IC packages 25 with electrical leads 27 are identified in FIGS. 5B and 7 as particular IC packages 192, 194, some of which have deformed electrical leads 193. IC packages having electrical leads 193 which are deformed inward with respect to the cartridge portion are jammed above the policing station by engaging the protuberances 182, halting the serial flow of IC packages along the track 150. IC packages having leads which are deformed outward with respect to the cartridge portion are jammed by the combination of the inside surface of the side plate 153 of the cover 152 and an opposing side plate section (not shown) attached to the open side of the track at policing station 180. The photoelectric sensors A, B, and C may be used to alert an operator, as previously described, to a jam condition at the policing station 180.

Referring to FIG. 5B, there is shown an IC package 192 jammed at the policing station 180. There is also shown IC packages 194 restrained from movement down the track 150 by the jammed IC package 192. Once alerted to the jam condition, the control system or an operator may actuate the ejector mechanism 190 to remove the jammed IC package 192 from the track 150 and thereby permit the IC packages 194 upstream to continue along the track 150 toward the loader head 66.

Ejector mechanism 190 includes an L-shaped ejector handle 191 slidably received within a slot 195 extending through the support member 154 and the track 150. The ejector handle 191 is pivotally connected to support member 154 by a pin 198 and includes a hand portion 197 projecting out of the slot for grasping by the operator. The ejector handle 191 rotates upward at pin 198 through the slot 195 and engages any IC packages, such as 192 and 194, on that portion of ridge 156 through which the slot passes. Ejector mechanism 190 further includes a flexible cover 184 which has a more narrow clearance above the upper surface of the IC package than that between the canopy 155 of cover 152 and the IC package. The flexible cover 184 serves, among other purposes, to guide any jammed IC packages. The flexible cover 184 is attached to the cover 152 by appropriate means such as a screw 202. The lower free end of the flexible cover 184 moves upwardly with pressure from the upward movement of the ejector handle 191.

In operation, by pressing upward on the ejector handle 191 of mechanism 190 as indicated by the arrow at 196, the ejector mechanism 190 begins to pivot upward about the pivot point at pin 198. Alternatively, the ejector handle 191 may be moved upward by a suitably arranged hydraulic mechanism, such as an air cylinder, in response to control signals from the control system. The upper surface of the ejector handle 191 of mechanism 190 has a raised portion 200, which is received within the slot 195 when the handle 191 is in the lower position. The raised portion 200 is arranged to contact the first IC package 194 after the bad IC package 192 and raise the package 194. The raised portion 200 of the ejector handle 191 lifts the IC package 194 into contact with the flexible cover 184 and thereafter raises the lower end of the flexible cover 184. The IC package 194 becomes pinned between the raised portion 200 and the cover 184 and will not be ejected.

Substantially simultaneously with raising the flexible cover 184, the upper surface of the ejector handle 191 of mechanism 190 lifts the jammed IC package 192 from the policing station 180. Because the IC package 192 is not trapped between the flexible cover 184 and the upper surface of the ejector handle 191, it drops from the ejector mechanism in response to the force due to gravity into a collecting station 204. The collecting station 204 comprises a box which extends laterally across the cover 152 at some point below the ejector mechanism 190. The ejector mechanism 190, operating in cooperation with the policing station 180, thereby provides an efficient and effective means for isolating and rejecting IC packages having deformed electrical leads.

CONTROL SYSTEM

Figure 11:
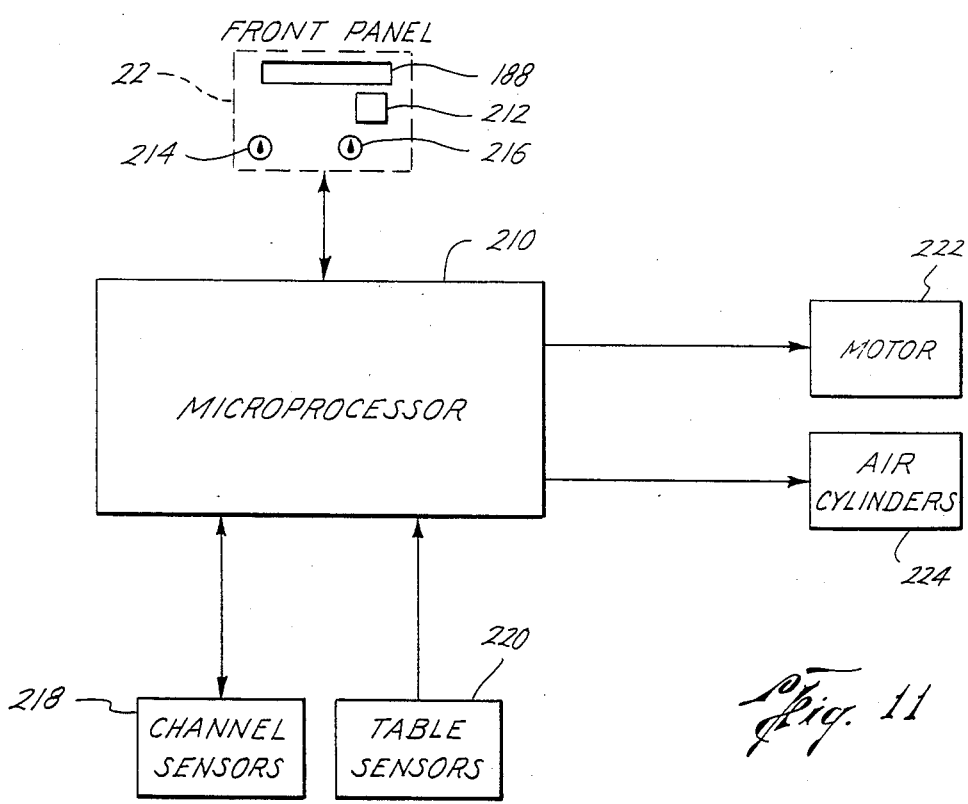
FIG. 11 shows a block diagram of a control system for the loader.

FIG. 11 shows a block diagram disclosing the basic organization of the control system for the loader 20. The control system is centered around a microprocessor 210, such as a CPU-1 Z-80 microprocessor manufactured by Mostek. The microprocessor 210 includes 4,000 bytes of programmable read-only memory (PROM) for storage of the software operating system and 256 bytes of random access memory (RAM) to function as work space for the central processing unit (CPU). The microprocessor 210 further includes a pair of input/output boards which communicate with a central processing unit of the microprocessor by means of a communication bus. The input/output boards may, for example, be an output board such as a Prolog 7602, which provides 48 transistor-to-transistor logic (TTL) open collector output lines and a Prolog 7604, which provides a plurality of lines which may be designated selectively as either input or output lines.

The front panel 22 of the loader 20, shown also in FIG. 1, includes a display panel 188, for displaying messages to the operator, a key pad 212 for commanding certain operations of the loader 20, a power switch 214, and a reset switch 216. The commands which may be communicated to the microprocessor by way of the key pad 212 include a start command, a stop command, and a step command. The key pad 212 may also be used to initiate tests of the loader apparatus 20.

In addition to the front panel, the control system comprises two input subsystems and two output subsystems. The first input subsystem is the channel sensor subsystem 218, which includes apparatus for communicating signals from the photoelectric sensors A, B, and C within the track 150 of the loader channel 72. The channel sensor subsystem 218 also includes an output signal line for each LED at 186 on the track 150. Signal lines connect each loader channel 72 by means of ribbon cable to a multiplexing printed circuit board, which is in turn connected by ribbon cable to input and output ports on the Prolog 7604 board. The multiplexing board facilitates selective connection of loader channels 72, several channels at a time, for processing by the CPU of the microprocessor 210.

The second input subsystem is the table sensor subsystem 220, which includes signals from the sensor means 80 for detecting table positions, a forward limit switch sensor for detecting the forwardmost point of travel of the table 24, a reverse limit switch sensor for detecting the limit of travel of the table 24 in the reverse direction 60, and a safety switch sensor 87 for preventing injury to an operator. Each of these sensors is connected directly to an input port on the Prolog 7604 board.

The first output subsystem is the motor subsystem 222 which includes apparatus by which movement of the table 24 is controlled. Three output signal lines, representing a pulse forward command, a pulse reverse command, and a half-step command, are connected from output ports on the Prolog 7602 board through optical isolation to a translator apparatus. The translator apparatus comprises the logic and power electronics by which the command signals from the microprocessor 210 are communicated to the stepper motor 48. The translator communicates with the stepper motor and generates motion thereof by means of rotating phase signals which causes precise incremental rotation of the motor shaft. Power is supplied to the translator through an independent alternating current source connected to the translator by means of a relay which is actuated when the system is powered up by means of the power switch 214 on the front panel 22. The software operating system for the microprocessor 210 includes acceleration and deceleration curves for the stepper motor 24.

The second output subsystem is the air cylinder subsystem 224, which includes hardware by which the microprocessor 210 controls actuation of the air cylinder 112 and the snubber air cylinder 128. Connection of the source of air pressure to the air cylinders 112 and the snubber cylinders 128 is controlled by means of solenoid actuated valves. There may be one solenoid valve for all of the air cylinders 112 and one solenoid valve for all of the snubber cylinders 128, or there may be a solenoid valve for each of the air cylinders 112 and each of the snubber cylinders 128, as is determined by or desired for a particular application.

Output signal lines connect output ports on the Prolog 7602 board to electronic relay devices, such as Opto-22 isolators, capable of generating a 110-volt alternating current signal in response to a TTL direct current signal from the microprocessor 210. The alternating current signals from the electronic relays are connected to the solenoid valve for actuation thereof. The air cylinder subsystem 224 further includes a pressure sensor, upstream of all solenoid valves, for detecting variations in system source pressure below a minimum pressure, for example, 75 psi, or above a maximum pressure, for example, 100 psi, for a 0.3 inch width IC package. The pressure sensor is connected to an input port on the Prolog 7604 board to cause the loader 20 to shut down in response to extreme preessure variations.

OPERATION OF THE LOADER

Referring now to FIGS. 5A, 8 and 9, the following is a basic description of the operation of the burn-in board loader 20. The loader 20 may be operated by one or two persons, depending on the size of the boards, the size of the IC packages, and the throughput rate. It is the job of a first operator to maintain IC packages within the loader channels 72. It is the job of a second operator, if available, to remove and replace burn-in boards on the table 24 and to command the loader apparatus 20. Before beginning, the first operator loads all of the loader channels 72 with IC packages. While the table 24 is positioned in the forwardmost direction 58, the second operator clamps one or more burn-in boards, the number of boards depending upon their size, to the table 24. When all preparations by the two operators have been completed, the second operator causes the loader to begin by entering the appropriate pattern at the keypad 212.

Referring now to FIGS. 4, 6 and 10, the control system of the loader 20 begins the operation by causing the table 24 to move in the reverse direction 60 until the trigger tooth 87 on the rearward end of the programming bar 76 deactivates the electronic switch within the rear sensor means 83, as was previously described for sensor means 80. When the rear sensor means 83 detects the presence of the trigger tooth 87, the table 24 is moved forward until the table position sensor means 80 detects the presence of the leading edge of the forwardmost tooth 78 of the programming bar 76. When the leading edge is detected, the table is stopped, thereby aligning the first row of sockets 74 under the loader heads 66.

While the first row of sockets was being properly positioned, an IC package 25 was forced from the track extension 168 onto the loading finger 170, the predetermined width of the loading finger insuring proper lateral alignment of the package. The IC package continued thereon in the forward direction 58 until the forwardmost electrical leads 27 of the IC package 25 contacted the saddle legs 142 of the alignment mechanism 102. Such alignment requires that the forwardmost extension of the cartridge portion of the IC package 25 must extend between the saddle legs 142 until the legs 142 contact the forwardmost electrical leads. Alignment by means of the electrical leads of an IC package, ratehr than the forwardmost portion of the body of the IC package, insures that the leads of the IC package will be properly positioned above the sockets. Substantial variations in the dimensions of the body of an IC package render alignment by the body undesirable because an IC package may become damaged due to improper alignment.

Once the IC package is in position on the loading finger 170 above a properly positioned socket 74 on the burn-in board 26, the air cylinder 112 is actuated to move heel 139 into engagement with the IC package and plant the IC package within the socket 74. As the heel 139 of shoe mechanism 118 contacts the upper surface of the body of the IC package and begins to force it in the downward direction, the loading finger 170 flexes to permit the lowering of the IC package into the socket and pins the IC package against the downwardly facing heel 139 of surface 138 of the shoe mechanism 118 so as to insure that proper positioning of the IC package is maintained during the lowering process.

As the heel 139 of shoe mechanism 118 lowers the IC package, the beveled rear edge 141 of the shoe mechanism 118 forces the next protruding IC package at the end of the track extension 168 back onto the track 150. While the shoe mechanism 118 is in the downward position, the snubber air cylinder 128 is actuated to lock the lowermost IC package within the track extension 168.

After the heel 139 of shoe mechanism 118 has planted the IC package within the socket 74 and the snubber cylinder 128 has locked the next IC package onto the track, the shoe mechanism 118 is raised and the table 24 is moved in the forward direction until the second tooth 78 on the programming bar 66 is detected by the sensor means 80, thereby aligning the next row of IC sockets under the loading finger 170. The forward motion of the table slides the loading finger 170 out from under the recently loaded IC package and allows the loading finger 170 to resume the horizontal position. The recently loaded IC package remains a short, vertical distance from full insertion into the socket, equal approximately to the thickness of the loading finger 170, for example, 0.020 inch.

Once the loading finger 170 has assumed again the horizontal position, the snubber air cylinder 128 is released, allowing the next IC package to be dropped onto the loading finger 170 from the track 150. As the next IC package is planted in its corresponding socket, the protruding toe 140 of the shoe mechanism 118 forces the previously planted IC package the remaining short, vertical distance, for example, 0.020 inch, into the socket. This completes the two-stage insertion process for a row of sockets. The process repeats itself as outlined above until each row of sockets of the burn-in board has been loaded with IC packages, whereupon the table travels to its forwardmost position to permit the second operator to remove the loaded burn-in board and replace it with an empty burn-in board.

Throughout the progression of the loading process, as described above, the three channel sensors 175, 177, 179 monitor the flow of IC packages down the track 150. In the event that a problem is detected, as shown in Table I above, the first operator is alerted to the nature and source of the problem. In the event that the first operator fails to take timely action to correct the problem, the control system will terminate operation of the loader until the problem has been corrected.

Occasionally, a socket must be removed from a burn-in board, for example, where fatigue due to normal wear and tear has resulted in failure of the socket. It is consequently useful for a burn-in board loader to be able to continue the loading operation on a board in spite of the absence of one more more sockets. The loader 20 is designed to accommodate such a situation. When a missing socket position is encountered, the loading finger 170 will retain the IC package in locked position against the heel 139 of shoe mechanism 118 while the latter mechanismn moves downward and then returns to the upward position. When the snubber cylinder 128 releases a second IC package, it moves into contact with the previous IC package, but is forced back into the track 150, as previously described, for a second time in response to the lowering of the shoe mechanism 118. Thus, the orderly loading process continues.

While a preferred embodiment of the invention has been shown and described, modifications thereof can be made by one skilled in the art without departing from the spirit of the invention.

What is claimed is:

1. Apparatus for loading integrated circuit components having a plurality of electrical leads into sockets on a printed circuit board, comprising:
   means for suspending a component over a socket, said suspending contacting the underside of the component;
   means forming a channel for slidably delivering to said suspending means a plurality of components disposed serially in said channel means, said channel means being angularly disposed;
   means for depositing the component into a socket, said suspending means and said depositing means gripping the component therebetween throughout;
   said channel means including policing means for isolating and rejecting components having deformed electrical leads, and a sensor means for monitoring the presence and absence of components within said channel means; and
   said policing means comprising a point of enlargement on said channel means for trapping a component having deformed leads, and an ejector mechanism for removing the trapped component;
   whereby said sensor means detects the presence of a trapped component in said policing means.

2. Apparatus for inserting integrated circuit packages into sockets on a burn-in board, comprising:
   a frame;
   a table slidably supported on said frame to move in a forward direction and a rearward direction;
   a plurality of loader heads for inserting integrated circuit packages into sockets, said loader heads being supported by said frame above said table;
   a plurality of angularly disposed loader channels for storing and delivering the packages to said loader heads, said channels being supported by said frame;
   a control system for receiving input signals from and communicating output signals to said apparatus; and
   each of said loader heads comprising:
      a shoe mechanism for pushing the packages into the sockets, said shoe mechanism including,
         a downward-facing heel at the base of a vertical portion of said mechanism for initially inserting a package into a socket to a predetermined depth,
         a downward-facing toe at the base of a horizontal portion extending forwardly from said heel and including a downward extension offset therefrom for secondarily inserting the package the remaining depth into the socket, and
         a bevelled lower edge on the rearward face of said vertical portion for translating downward motion of said mechanism to generally horizontal motion of an IC package back within said loader channel;
      a support body for supporting said shoe mechanism, said support body being slidably and rotatably supported on said frame above said table;
      an air cylinder affixed to said support body, said air cylinder being in communication with said control system and having a plunger attached to said shoe mechanism so as to lower said mechanism from said support body on actuation thereof; and
      an alignment mechanism affixed to said support body, said alignment mechanism having a pair of saddle legs straddling opposing sides of said toe of said shoe mechanism so as to form a path for the package therebetween.

3. Method for loading integrated circuit packages having a plurality of electrical leads into sockets on a burn-in board, comprising the steps of:
   moving a slidable table with a burn-in board affixed thereto in a forward direction;
   stopping said table when a first extension of said table actuates a table position switch;
   deactivating a snubber air cylinder to release a first integrated circuit package from a lowermost end of a loader channel;
   gravity-feeding the first package from said loader channel onto a flexible loading finger overlying a first socket on the burn-in board, a second integrated circuit package engaging the rearward end of the first package;
   stopping forward motion of the first package on said finger by contact between the electrical leads of the first package and an alignment mechanism;
   activating a second air cylinder and thereby moving a shoe mechanism downward, a rearward portion of said shoe mechanism engaging the upper surface of the first package;
   pushing the second package back into said loader channel by engaging the second package with a downwardly moving beveled rearward edge of said shoe mechanism;
   holding the second package within said loader channel by engagement thereof with the rearward face of said shoe mechanism;
   activating said snubber air cylinder to lock the second package within said loader channel;
   clamping the first package between said downwardly moving shoe mechanism and said flexible finger, which bends to accommodate downward motion thereof;
   moving the electrical leads of the first package into contacts in the first socket;
   engaging the first socket with said flexible finger;
   substantially simultaneously with insertion of the first package, pushing a third integrated circuit package a short distance to achieve full insertion into a second socket by engagement with a forward portion of said shoe mechanism, the second socket being positioned forwardly of the first socket;

deactivating said second air cylinder to raise said shoe mechanism;

moving said table in the forward direction and thereby sliding said flexible finger from engagement between the first package and the first socket;

stopping said table when a second extension of said table actuates said table position switch.

4. Apparatus for inserting integrated circuit packages into sockets on a burn-in board, comprising:

a frame;

a table slidably supported on said frame to move in a foward direction and a rearward direction;

a plurality of loader heads for inserting integrated circuit packages into sockets, said loader heads being supported by said frame above said table;

a plurality of angularly disposed loader channels for storing and delivering the packages to said loader heads, said channels being supported by said frame;

a control system for receiving input signals from and communicating output signals to said apparatus; and each of said loader channels comprising:

an angularly disposed track for storing and transporting packages to a corresponding loader head, said track including a longitudinally extending upper ridge protruding upwardly from a member having a generally rectangular cross section, means for removably and slidably supporting said track on said frame above said table with the lower end of said track communicating with the corresponding loader head, a generally L-shaped cover affixed to said track and including a side plate enclosing one side of said ridge and a canopy extending over the top of said ridge, said cover cooperating with said track to define a path substantially enclosed on three sides of the packages and conforming generally to the cross-sectional geometry of the packages, a flexible loading finger extending forwardly from said support means and defining a generally horizontally planar surface arranged to receive and to support a package communicated from the lower end of said track, said loading finger supporting the package from the lower side thereof while the package is inserted in the socket by said loader head, a snubber air cylinder disposed at the lower end of said track, said snubber air cylinder being in communication with said control system and having a plunger for engaging the package at the lowermost end of the track, means at the upper end of said track for supporting an integrated circuit package storage tube as a linear extension of said track, a policing station including an enlargement of the width of the ridge along a section thereof for trapping thereabove a package having deformed electrical leads, and an ejector mechanism for removing and collecting packages which become trapped at said policing station, including a slot in said rectangular member of said track, an ejector handle rotatably received within said slot, said handle having an upper surface defining a protrusion thereon to engage the lower surface of a package immediately above and adjacent to the package trapped at said policing station, a flexible cover affixed to said canopy and overlying packages on said ridge at and above said policing station, and a collecting station attached laterally across said plurality of channels for receiving packages removed from said policing station;

whereby upward rotation of said ejector handle engages the package above and adjacent to the trapped package, between said protrusion and said flexible cover, so that packages above the trapped package remain on said track, while said upper surface of said ejector handle lifts the trapped package from said policing station and allows it to fall into said collecting station.

5. Apparatus for loading dual in-line integrated circuit packages having a plurality of electrical leads into sockets on a printed circuit board, comprising:

means for flexibly supporting a package above a socket; and means for pushing the package into the socket, said support means biasing the package against said pushing means and bending in response to motion of said pushing means to lower the package into the socket.

6. Apparatus according to claim 5 further comprising means for delivering packages to said support means.

7. Apparatus according to claim 6 wherein said support means comprises a flexible member, secured at a first end thereof to and substantially continuous with said delivering means, having a width less than the width of the packages.

8. Apparatus according to claim 5 wherein said pushing means comprises:

a shoe mechanism for engaging the package disposed on said support means; and means for moving said shoe mechanism into contact with the package.

9. Apparatus according to claim 8 wherein said shoe mechanism comprises:

a downward-facing heel at the base of said shoe mechanism for initially inserting a package into a socket to a predetermined depth; and a downward-facing toe offset downwardly from and forwardly of said heel for secondarily inserting the package the remaining depth into the socket.

10. Apparatus for loading integrated circuit components having a plurality of electrical leads into sockets on a printed circuit board, comprising:

means for suspending a component over a socket;

means forming a channel for slidably delivering to said suspending means a plurality of components disposed serially in said channel means, said channel means being angularly disposed and including a point of enlargement thereon for trapping a component having deformed leads and an ejector mechanism for removing the trapped component; and means for depositing components from said channel means into a socket.

11. Apparatus for inserting integrated circuit packages into sockets on a burn-in board, comprising:

a frame;

a table slidably supported on said frame;

a plurality of loader heads for inserting integrated circuit packages into sockets; said loader heads being supported by said frame above said table and including a shoe mechanism for pushing the packages into the sockets, such shoe mechanism including a downward-facing heel at the base of said mechanism for initially inserting a package into a socket to a predetermined depth and a downward-facing toe having a downward extension offset from and forwardly of said heel for secondarily inserting the package the remaining depth into the socket;

a plurality of angularly disposed loader channels for storing and delivering the packages to said loader heads; and a control system for receiving input signals from and communicating output signals to said apparatus.

12. Apparatus for inserting integrated circuit packages into sockets on a burn-in board, comprising:

a frame;

a table slidably supported on said frame;

a plurality of loader heads for inserting integrated circuit packages into sockets, said loader heads being supported by said frame above said table;

a plurality of angularly disposed loader channels for storing and delivering the packages to said loader heads, said loader channels including an angularly disposed track for storing and transporting packages to a corresponding loader head and means for flexibly supporting a package above a socket including a flexible loading finger extending forwardly from said track and defining a generally horizontal planar surface for receiving and supporting a package communicated from said track;

means forming a part of each said loader head for pushing the package into the socket, said support means biasing the package against said pushing means and bending in response to motion of said pushing means to lower the package into the socket; and a control system for receiving input signals from and communicating output signals to said apparatus.

13. Apparatus according to claim 12 wherein said loader channels further comprise a policing station including an enlargement of the width of said track along a section thereof for trapping thereabove a package having deformed electrical leads.

14. Apparatus according to claim 13 wherein said loader channels further comprise an ejector mechanism for removing and collecting packages which become trapped at said policing station.

* * * * *